(12) United States Patent
Abe et al.

(10) Patent No.: US 12,381,120 B2
(45) Date of Patent: Aug. 5, 2025

(54) CIRCUIT BASE, AND HEAT DISSIPATION BASE OR ELECTRONIC DEVICE PROVIDED WITH SAME

(71) Applicant: KYOCERA Corporation, Kyoto (JP)

(72) Inventors: Yuichi Abe, Satsumasendai (JP); Takeshi Muneishi, Kusatsu (JP)

(73) Assignee: KYOCERA Corporation, Kyoto (JP)

( * ) Notice: Subject to any disclaimer, the term of this patent is extended or adjusted under 35 U.S.C. 154(b) by 570 days.

(21) Appl. No.: 17/442,534

(22) PCT Filed: Mar. 24, 2020

(86) PCT No.: PCT/JP2020/013039
§ 371 (c)(1),
(2) Date: Sep. 23, 2021

(87) PCT Pub. No.: WO2020/196528
PCT Pub. Date: Oct. 1, 2020

(65) Prior Publication Data
US 2022/0189837 A1 Jun. 16, 2022

(30) Foreign Application Priority Data
Mar. 25, 2019 (JP) .................. 2019-056841

(51) Int. Cl.
*H01L 23/14* (2006.01)
*H01L 23/15* (2006.01)
*H01L 23/373* (2006.01)
(52) U.S. Cl.
CPC ............ *H01L 23/142* (2013.01); *H01L 23/15* (2013.01); *H01L 23/3731* (2013.01)

(58) Field of Classification Search
None
See application file for complete search history.

(56) References Cited

U.S. PATENT DOCUMENTS

| | | | |
|---|---|---|---|
| 6,107,638 A | * | 8/2000 | Sumino .................. C04B 37/026 257/629 |
| 9,693,449 B2 | * | 6/2017 | Nishimoto ............... H05K 7/14 |
| 2011/0074010 A1 | | 3/2011 | Kuromitsu et al. |
| 2013/0236738 A1 | | 9/2013 | Yamauchi et al. |

FOREIGN PATENT DOCUMENTS

| | | |
|---|---|---|
| CN | 102593009 A | 7/2012 |
| CN | 103282546 A | 9/2013 |
| JP | H11-154719 A | 6/1999 |
| JP | 2010-16349 A | 1/2010 |
| JP | 2012-115846 A | 6/2012 |
| JP | 2017-135197 A | 8/2017 |

OTHER PUBLICATIONS

L. J. Dy et al., "Study of thin film metallization adhesion in ceramic multichip module," 2012 IEEE 14th Electronics Packaging Technology Conference (EPTC), Singapore, 2012, pp. 67-71, doi: 10.1109/EPTC.2012.6507053. (Year: 2012).*

* cited by examiner

*Primary Examiner* — Dale E Page
*Assistant Examiner* — Derek L Nielsen
(74) *Attorney, Agent, or Firm* — Procopio, Cory, Hargreaves & Savitch LLP

(57) ABSTRACT

A circuit base of the present disclosure includes a base made of ceramic, a joint layer located on the base, and a metal layer located on the joint layer. The metal layer contains copper. The joint layer contains aluminum, silicon, and oxygen.

8 Claims, 6 Drawing Sheets

CIRCUIT BASE, AND HEAT DISSIPATION BASE OR ELECTRONIC DEVICE PROVIDED WITH SAME

CROSS-REFERENCE TO RELATED APPLICATIONS

This application is national stage application of International Application No. PCT/JP2020/013039, filed on Mar. 24, 2020, which designates the United States, incorporated herein by reference, and which claims the benefit of priority from Japanese Patent Application No. 2019-056841, filed on Mar. 25, 2019, the entire contents of which are incorporated herein by reference.

TECHNICAL FIELD

The present disclosure relates to a circuit base, and a heat dissipation base or an electronic device provided with the circuit base.

BACKGROUND ART

Electronic devices are known in which a metal layer is provided on a circuit base, and various electronic components such as a semiconductor element, a heating element, a Peltier element and the like are mounted on the metal layer. The circuit base used in such applications includes a base and a metal layer that is located on the base and is made of copper having excellent heat dissipation.

Ceramic having both excellent insulating properties and mechanical strength is used for the base. As a joint layer that connects the base and the metal layer, for example, a brazing material containing silver and copper as main components is used (for example, see Patent Document 1).

CITATION LIST

Patent Literature

Patent Document 1: JP 2012-115846 A

SUMMARY

A circuit base of the present disclosure includes a base made of ceramic, a joint layer located on the base, and a metal layer located on the joint layer. The metal layer contains copper. The joint layer contains aluminum, silicon, and oxygen.

Advantageous Effects of Invention

The circuit base of the present disclosure is a product in which cracking is unlikely to occur in the joint layer even when the circuit base is repeatedly heated and cooled, and which can be used stably over a long period of time.

DESCRIPTION OF EMBODIMENTS

Hereinafter, a circuit base of the present disclosure will be described in detail with reference to the drawings.

Figure 1:
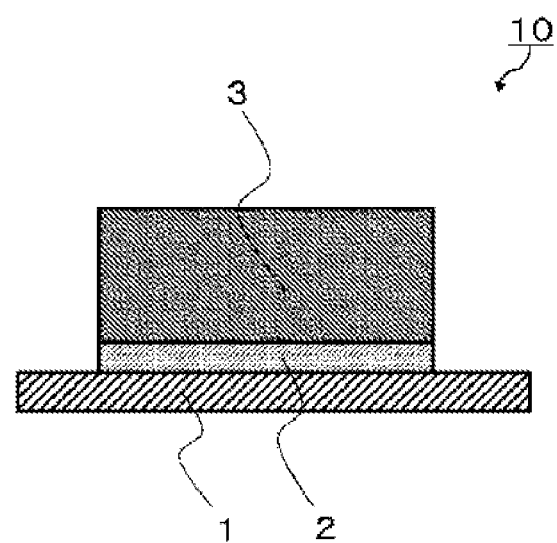
FIG. 1 is a cross-sectional view schematically illustrating a circuit base according to a first embodiment of the present disclosure.

A circuit base 10 of a first embodiment of the present disclosure includes a base 1, a joint layer 2 located on the base 1, and a metal layer 3 located on the joint layer 2, as illustrated in FIG. 1.

In the first embodiment, the base 1 is made of ceramic. As the ceramic, for example, ceramic containing aluminum or silicon, such as silicon carbide ceramic, aluminum oxide-based ceramic, aluminum oxide-based ceramic containing zirconium oxide, silicon nitride-based ceramic, or aluminum nitride-based ceramic, may be used.

When the base 1 is made of nitride-based ceramic such as silicon nitride-based ceramic, aluminum oxide-based ceramic, or aluminum nitride-based ceramic, the base 1 has high thermal conductivity, which makes it possible to improve heat dissipation of the circuit base 10 of the first embodiment. Note that silicon nitride-based ceramic is a material in which silicon nitride accounts for 70 mass % or more of 100 mass % of all components forming the silicon nitride-based ceramic. Aluminum oxide-based ceramic is a material in which aluminum oxide accounts for 70 mass % among all the components forming the aluminum oxide-based ceramic. Aluminum nitride-based ceramic is a material in which aluminum nitride accounts for 70 mass % or more among all the components forming the aluminum nitride-based ceramic.

The material of the base 1 may be confirmed by the following method. First, the value of 2θ (where 2θ indicates a diffraction angle) obtained by measurement with an X-ray diffractometer (XRD) is identified using a JCPDS card, thereby identifying the constituent components forming the target base. Next, quantitative analysis is performed on the target base by using an inductively coupled plasma emission spectrophotometer (ICP). At this time, in a case where the constituent component identified by the XRD is silicon nitride, and when a value obtained by conversion from the content of silicon (Si) measured by the ICP to silicon nitride ($Si_3N_4$) is equal to or greater than 70 mass %, the material is silicon nitride-based ceramic. Note that the same applies to other types of ceramic.

The metal layer 3 in the circuit base 10 of the first embodiment of the present disclosure contains copper. Since the metal layer 3 contains copper having high thermal conductivity, the circuit base 10 of the first embodiment of the present disclosure has excellent heat dissipation. The metal layer 3 may contain 90 mass % or more of copper of 100 mass % of all the components forming the metal layer 3, for example. Since most of the metal layer 3 is formed of copper having high thermal conductivity, the circuit base 10 of the first embodiment of the present disclosure has excellent heat dissipation.

Note that the average thickness of the metal layer 3 may be, for example, in a range of 100 μm or more and 3000 μm or less.

The joint layer 2 in the circuit base 10 of the first embodiment of the present disclosure contains aluminum, silicon, and oxygen. In the joint layer 2, the total amount of aluminum, silicon, and oxygen may account for 95 mass % or more, for example, of 100 mass % of all the components forming the joint layer 2.

Specifically, in the joint layer 2, of 100 mass % of all the components forming the joint layer 2, the amount of aluminum may be in a range of 70 mass % or more and 85 mass % or less, silicon may be in a range of 4 mass % or more and 15 mass % or less, and oxygen may be in a range of 5 mass % or more and 15 mass % or less.

Satisfying such a configuration makes it possible to firmly bond the base 1 made of ceramic and the metal layer 3 containing copper to each other by using the joint layer 2.

Figure 2:
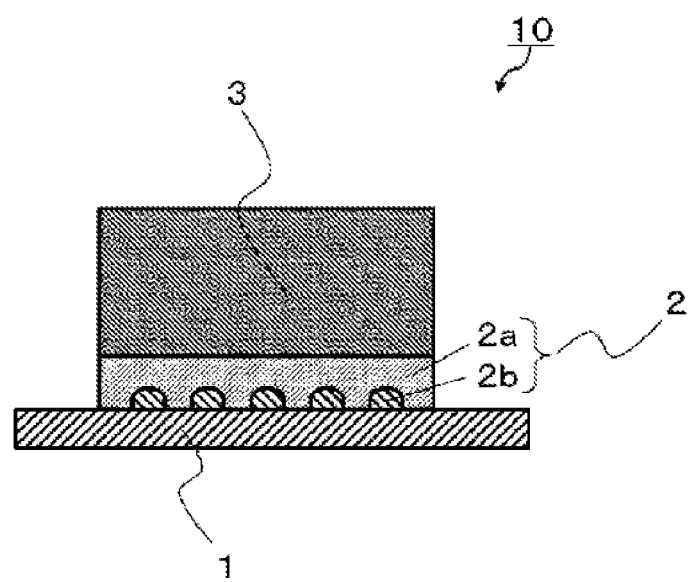
FIG. 2 is a cross-sectional view schematically illustrating a circuit base according to a second embodiment of the present disclosure.

As illustrated in FIG. 2, a joint layer 2 in a circuit base 10 of a second embodiment of the present disclosure may include a first region 2a and a second region 2b.

The first region 2a is mainly in contact with the metal layer 3, and the second region 2b is in contact with the base 1.

The first region 2a contains aluminum or an aluminum alloy. The aluminum alloy contains silicon.

The second region 2b may contain aluminum silicide. Aluminum silicide has a high affinity with aluminum or an aluminum alloy. Because of this, the first region 2a and the second region 2b are likely to be strongly bonded.

The second region 2b may contain SiAlON. SiAlON has a high affinity with aluminum or an aluminum alloy. Because of this, the first region 2a and the second region 2b are likely to be strongly bonded.

In a case where the second region 2b contains aluminum silicide or SiAlON, the affinity with aluminum or silicon contained in the base 1 is high. Accordingly, the second region and the base are likely to be strongly bonded. Because of this, the base 1 and the joint layer 2 are likely to be strongly bonded.

In a case where the second region 2b is formed of aluminum silicide, the affinity with the base 1 formed of aluminum oxide-based ceramic is high. Accordingly, the second region and the base are likely to be strongly bonded. Because of this, the base 1 and the joint layer 2 are likely to be strongly bonded.

In a case where the second region 2b is formed of SiAlON, the affinity with the base 1 formed of silicon nitride-based ceramic or aluminum nitride-based ceramic is high. Accordingly, the second region and the base are likely to be strongly bonded. Because of this, the base 1 and the joint layer 2 are likely to be strongly bonded.

Since the base 1 is firmly bonded to the joint layer 2, the base 1 is firmly bonded with the metal layer 3. Accordingly, even when heating and cooling are repeated, cracking is unlikely to occur in the joint layer 2. With this, the circuit base 10 of the second embodiment of the present disclosure can be used over an extended period of time.

Figure 3:
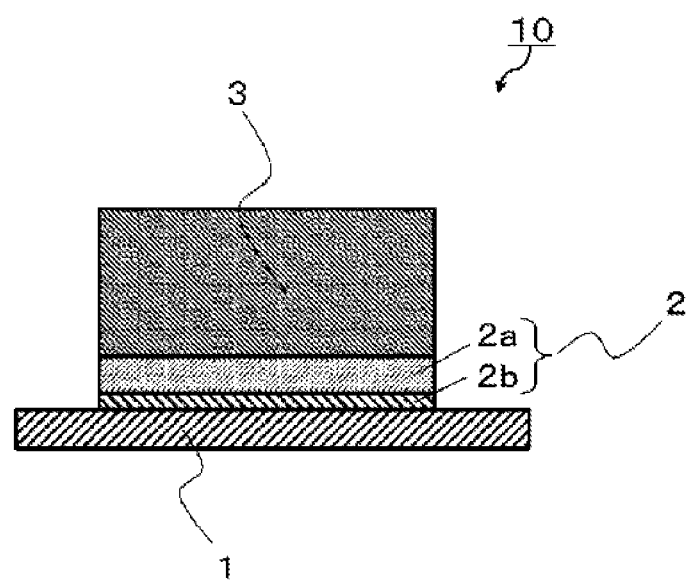
FIG. 3 is a cross-sectional view schematically illustrating a circuit base according to a third embodiment of the present disclosure.

As indicated by the circuit base 10 of FIG. 3, as a third embodiment, a second region 2b of a joint layer 2 may be formed in a layer shape sandwiched between a first region 2a and a base 1.

Note that the average thickness of the joint layer 2 may be, for example, in a range of 5 μm or more and 40 μm or less.

Here, the components respectively forming the joint layer 2 and a metal layer 3, and the contents thereof may be confirmed by the following method. First, the circuit base 10 of the second or third embodiment of the present disclosure is cut in such a manner as to have a cross-sectional shape as illustrated in FIG. 2 or 3, and the circuit base 10 is polished using a cross-section polisher (CP) to obtain a polished surface. Next, with the polished surface used as an observation surface, an energy dispersive X-ray spectrometer (EDS) attached to a scanning electron microscope (SEM) may be used to measure the components respectively forming the joint layer 2 and the metal layer 3 and the content thereof. Alternatively, the joint layer 2 and the metal layer 3 each may be ground, and the components respectively forming the joint layer 2 and the metal layer 3 and the contents thereof may be measured using the ICP or an X-ray fluorescence spectrometer (XRF).

The following is a method for confirming whether the second region 2b of the joint layer 2 is constituted of SiAlON or aluminum silicide: when elemental analysis is performed, in a case where aluminum and silicon are present in the same manner, aluminum silicide is regarded as being present, and in a case where silicon, aluminum, oxygen, and nitrogen are present in the same manner, SiAlON is regarded as being present.

Figure 4:
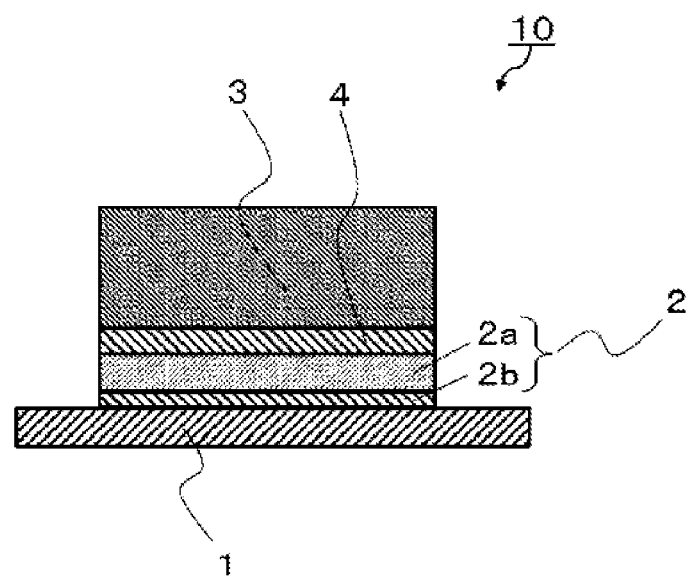
FIG. 4 is a cross-sectional view schematically illustrating a circuit base according to a fourth embodiment of the present disclosure.

As illustrated in FIG. 4, the circuit base 10 of a fourth embodiment of the present disclosure may include an intermediate layer 4 between the joint layer 2 and the metal layer 3, and the intermediate layer 4 may include titanium, tungsten, or molybdenum.

The intermediate layer 4 easily suppresses diffusion of aluminum in the first region 2a of the joint layer 2 into the metal layer 3. Further, strength of the joint layer 2 can be maintained. Furthermore, the base 1 and the metal layer 3 can be further strongly bonded due to the affinity between an aluminum alloy in the first region 2a of the joint layer 2 and the intermediate layer 4. Accordingly, even when heating and cooling are repeated, cracking is unlikely to occur in the joint layer 2.

The intermediate layer 4 may have a total of 50 mass % or more of titanium, tungsten, and molybdenum, for example, of 100 mass % of all the components forming the intermediate layer 4.

The average thickness of the intermediate layer 4 may be, for example, in a range of 0.5 μm or more and 5 μm or less.

Note that the presence of the intermediate layer 4 may be confirmed as follows: with the above-discussed polished surface used as an observation surface, surface analysis is performed using an electron probe microanalyzer (EPMA) to determine whether a layer of titanium, tungsten, or molybdenum is present in color mapping of the surface analysis. The content of the component forming the intermediate layer 4 need only be measured by using an EDS attached to an SEM, with the above-discussed polished surface used as an observation surface.

Titanium contained in the intermediate layer 4 in the circuit base 10 of the fourth embodiment of the present disclosure may be present as hydride, oxide, nitride, carbide, or carbonitride. When the above configuration is satisfied, even in a case where heating and cooling are repeated, the diffusion of aluminum in the first region 2a of the joint layer 2 into the metal layer 3 can be further suppressed, and the strength of the joint layer 2 can be further maintained. Furthermore, since the base 1 and the metal layer 3 can be more strongly bonded due to the affinity between the aluminum alloy in the first region 2a of the joint layer 2 and the intermediate layer 4, cracking is unlikely to occur in the joint layer 2 even in a case where heating and cooling are repeated.

The intermediate layer 4 may contain, for example, 50 mass % or more of titanium of 100 mass % of all the components forming the intermediate layer 4.

Note that whether or not hydride, oxide, nitride, carbide, or carbonitride is present in the titanium contained in the intermediate layer 4 need only be confirmed by the following method. First, surface analysis is performed using an EPMA, with the polished surface discussed above used as an observation surface. Then, in the color mapping of the surface analysis, oxide is considered to be present when a location where titanium and oxygen are simultaneously present is confirmed. In the color mapping of the surface analysis, nitride is considered to be present when a location where titanium and nitrogen are simultaneously present is confirmed. In the color mapping of the surface analysis, carbide is considered to be present when a location where titanium and carbon are simultaneously present is confirmed. In the color mapping of the surface analysis, carbonitride is considered to be present when a location where titanium, carbon, and nitrogen are simultaneously present is confirmed. Note that in a method for confirming the presence of hydride, the intermediate layer need only be cut out and the presence of hydride need only be confirmed using secondary ion mass spectrometry (SIMS).

Figure 5:
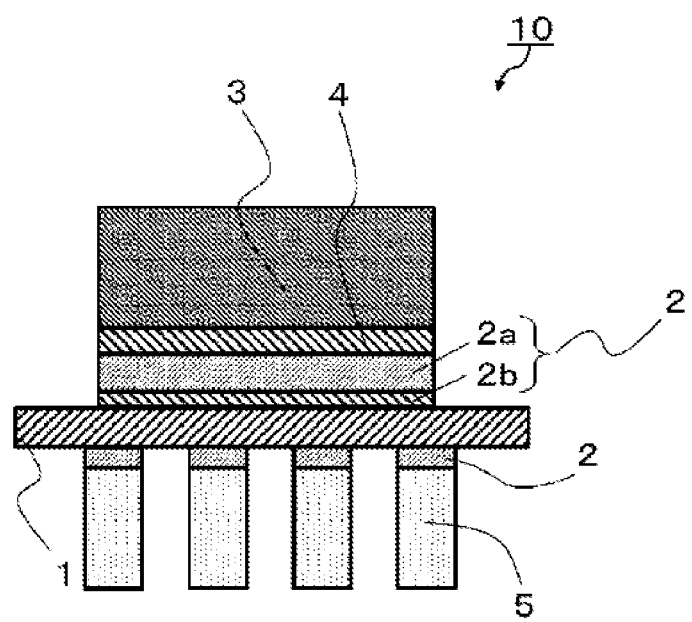
FIG. 5 is a cross-sectional view schematically illustrating a circuit base according to a fifth embodiment of the present disclosure.

As illustrated in FIG. 5, the circuit base 10 of a fifth embodiment of the present disclosure may be provided with fins 5 on the base 1.

The fins 5 may be provided on the base 1 on a side opposite to the joint layer 2.

Each fin 5 may be formed of aluminum, for example. As described above, since each fin 5 is formed of aluminum having high thermal conductivity, heat dissipation may be improved by providing the fins 5.

Further, as illustrated in FIG. 5, in the circuit base 10 of the present disclosure, the joint layer 2 may be located between the base 1 and the fins 5.

As illustrated in FIG. 2 or 3, the joint layer 2 in the circuit base 10 of the present disclosure may include the first region 2a and the second region 2b.

The base 1 in the circuit base 10 of the present disclosure may include a channel inside. When such a configuration is satisfied, an electronic component on the metal layer 3 may be effectively cooled by causing a cooling fluid (hereinafter, referred to as a refrigerant) to flow in the channel. Note that the channel may have any shape and size.

Figure 6:
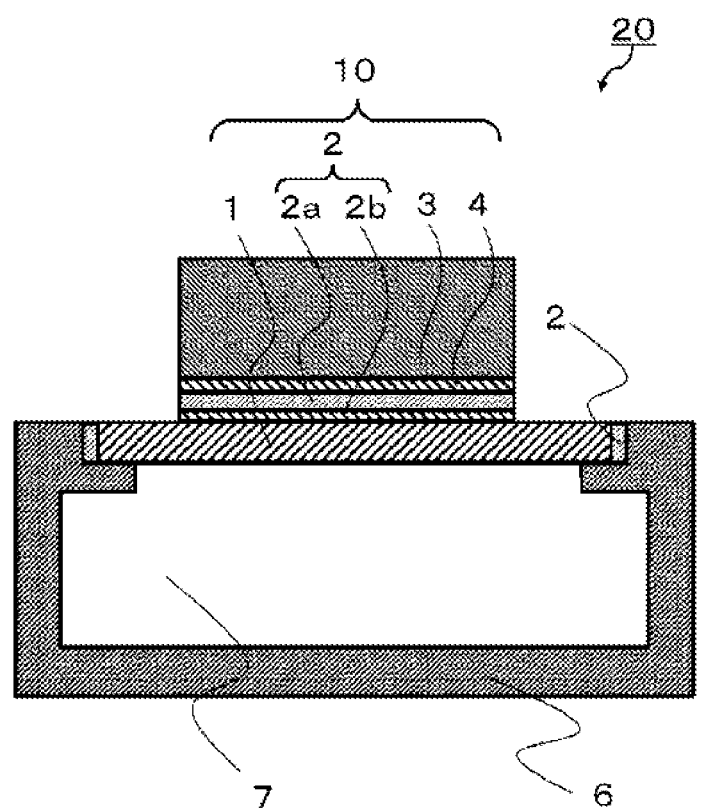
FIG. 6 is a cross-sectional view schematically illustrating a heat dissipation base of the present disclosure.

As illustrated in FIG. 6, in a heat dissipation base 20 of the present disclosure, a channel 7 is formed by the circuit base 10 and a member 6. Here, the member 6 is made of aluminum or an aluminum alloy. By satisfying such a configuration, since the heat dissipation base 20 of the present disclosure is light-weight and has excellent heat dissipation in comparison with a case in which the member is made of ceramic or the like, it is possible to effectively cool an electronic component on the metal layer 3 by causing a refrigerant to flow in the channel 7.

As illustrated in FIG. 6, in the heat dissipation base 20 of the present disclosure, the joint layer 2 may be located between the base 1 of the circuit base 10 and a member 6. When such a configuration is satisfied, the base 1 made of ceramic and the member 6 made of aluminum or an aluminum alloy are firmly bonded, so that the heat dissipation base 20 of the present disclosure is suitable for long-term use.

An electronic device of the present disclosure includes an electronic component located on the metal layer 3 in the circuit base 10. Alternatively, the electronic device includes an electronic component located on the metal layer 3 in the circuit base 10 of the heat dissipation base 20. Satisfying such a configuration makes it possible for the electronic device of the present disclosure to be used for a long period of time and to have excellent reliability.

As the electronic component, the following can be used: a semiconductor element such as a light-emitting diode (LED) element, a laser diode (LD) element, an insulating gate bipolar transistor (IGBT) element, an intelligent power module (IPM) element, a metal-oxide field-effect transistor (MOSFET) element, a freewheeling diode (FWD) element, a giant transistor (GTR) element, a Schottky barrier diode (SBD), a high electron mobility transistor (HEMT) element, and a complementary metal oxide semiconductor (CMOS), a heating element for a sublimation thermal printer head or a thermal ink-jet printer head, and a Peltier element.

Next, an example of a manufacturing method for a circuit base of the present disclosure will be described.

First, a base made of ceramic is prepared by a known method. Specifically, a molded body is prepared by extruding a ceramic raw material in the form of a green body or laminating the ceramic raw material in a tape shape. Then, the molded body is fired, thereby making it possible to produce the base. Note that the base may include a channel inside.

Subsequently, a metal layer containing 90 mass % or more of copper is prepared. Here, in order to interpose an intermediate layer containing titanium, tungsten, or molybdenum between a joint layer and a metal layer described below, a solvent containing a compound of titanium, molybdenum, or tungsten, which is an alkoxide-based or chelate-based compound, is applied on the metal layer by screen printing, brush coating, ink-jet coating, bar coating, spraying, or the like, and is subjected to heat treatment at a temperature in a range of 150° C. or more and 650° C. or less for 15 minutes or longer, thereby forming the intermediate layer in the metal layer in advance. Here, when screen printing is used, it is easy to make the intermediate layer have any thickness. By using a solvent containing a compound of titanium, molybdenum, or tungsten, which is an alkoxide-based or chelate-based compound, the intermediate layer may be formed quickly while having uniform film quality even when the surface area of the intermediate layer is large. As another method for interposing the intermediate layer, sputtering, vaporizing, ion plating, plating, film formation, or the like may be used for forming the intermediate layer.

Note that, in order for the intermediate layer to contain titanium hydride, titanium oxide, titanium nitride, titanium carbide, or titanium carbonitride, the following method may be used.

In the case of titanium hydride, a titanium-containing layer is formed by sputtering, vaporizing, ion plating, plating, film formation, or printing with a solvent containing titanium, and thereafter the formed layer is subjected to heat treatment in a hydrogen gas atmosphere at 550° C. or lower.

In the case of titanium oxide, a titanium-containing layer is formed by printing with a solvent containing titanium, and thereafter the formed layer is subjected to heat treatment in an inert gas atmosphere at a temperature in a range of 500° C. or more and 650° C. or less.

In the case of titanium nitride, a titanium-containing layer is formed by sputtering, vaporizing, ion plating, plating, film formation, or printing with a solvent containing titanium, and thereafter the formed layer is subjected to heat treatment in a nitrogen atmosphere at a temperature in a range of 500° C. or more and 650° C. or less.

In the case of titanium carbonitride, a titanium-containing layer is formed by printing with a solvent containing titanium, and thereafter the formed layer is subjected to heat treatment in a nitrogen atmosphere at a temperature in a range of 500° C. or more and 650° C. or less.

In the case of titanium carbide, a titanium-containing layer is formed by printing with a solvent containing titanium, and thereafter the formed layer need only be subjected to heat treatment in an inert gas atmosphere or a nitrogen atmosphere at a temperature in a range from 500° C. to 650° C.

As the solvent for the above-discussed "titanium-containing solvent", an alkoxide-based solvent, a chelate-based solvent, or the like may be used.

Next, a paste containing siloxane and aluminum to serve as a joint layer is prepared. Here, the blending ratio of siloxane and aluminum need only be such that, after the heat treatment performed at the time of bonding described below, the total amount of aluminum, silicon, and oxygen accounts for 95 mass % or more of 100 mass % of all the components forming the joint layer.

An aluminum scaly powder may be used. By using such powder, the joint layer may be efficiently formed because aluminum spreads over a wide range. In particular, the second region $2b$ is easily formed.

The thickness of the scaly aluminum may be, for example, in a range of 1 µm or more and 5 µm or less.

The outer diameter of the scaly aluminum may be, for example, in a range of 10 µm or more and 20 µm or less.

Next, a paste to serve as the joint layer is applied, by screen printing, brush coating, ink-jet coating, bar coating, spraying, or the like, onto one of the surfaces to be bonded of the base or the metal layer (the intermediate layer when the metal layer includes the intermediate layer). Here, when screen printing is used, it is easy to make the joint layer have any thickness.

Next, heat treatment is performed for at least 15 minutes at a temperature in a range of 560° C. or more and 700° C. or less in a vacuum of $1\times10^4$ Pa or lower. Due to the heat treatment, an Si—O—Si group in siloxane and aluminum react with each other to form an aluminum alloy. When the Si—O—Si group in siloxane and aluminum react with each other, the surface side of the base is decomposed to form a compound such as aluminum silicide or SiAlON. For example, when the base is made of aluminum oxide-based ceramic, aluminum silicide is formed. When the base is made of nitride-based ceramic such as aluminum nitride-based ceramic or silicon nitride-based ceramic, SiAlON is formed. In this way, the joint layer containing silicide or SiAlON is formed. Silicide or SiAlON has a high affinity with aluminum or silicon contained in the base. Accordingly, the joint layer may firmly bond the base and the metal layer. With this, the circuit base of the present disclosure is achieved.

Note that in a case where the intermediate layer contains titanium nitride, the Si—O—Si group in siloxane and aluminum react with each other due to the heat treatment, and the formed melt containing an aluminum alloy and titanium nitride exhibits preferable wettability, so that no vacancy is generated and stronger bonding may be obtained.

The intermediate layer may contain titanium, tungsten, molybdenum, titanium hydride, titanium oxide, or titanium carbide.

The heat dissipation base of the present disclosure is achieved in the following manner: a member made of aluminum or an aluminum alloy provided with a recessed portion is prepared; prior to performing heat treatment on a paste to serve as the joint layer described above, the paste to serve as a joint layer is disposed between the base and the member in such a manner as to constitute a channel by the base and the member; and thereafter the heat treatment is performed under the above described conditions.

Then, the electronic device of the present disclosure is achieved by mounting an electronic component on the metal layer of the circuit base or the heat dissipation base.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A circuit base comprising:
   a base made of ceramic;
   a joint layer located on the base; and
   a metal layer located on the joint layer,
   wherein the metal layer comprises copper,
   the joint layer comprises aluminum, silicon, and oxygen,
   the joint layer comprises a first region and a second region,
   the first region comprises at least one of aluminum and an aluminum alloy,
   the second region is formed of SiAlON or aluminum silicide,
   the first region is in contact with the base layer and the metal layer, and
   the second region is in contact with the base layer and the first region.

2. The circuit base according to claim 1, further comprising:
   an intermediate layer between the joint layer and the metal layer,
   wherein the intermediate layer comprises titanium, tungsten, or molybdenum.

3. The circuit base according to claim 2, wherein the titanium is present as hydride, oxide, nitride, carbide, or carbonitride.

4. The circuit base according to claim 1, wherein the base comprises a channel inside the base.

5. A heat dissipation base that constitutes a channel by the circuit base according to claim 1 and a member made of aluminum or an aluminum alloy.

6. The heat dissipation base according to claim 5, wherein the joint layer is located between the base of the circuit base and the member.

7. An electronic device comprising:
   an electronic component located on the metal layer in the circuit base according to claim 1.

8. An electronic device comprising:
   an electronic component located on the metal layer in the circuit base of the heat dissipation base according to claim 5.

* * * * *